(12) United States Patent
Arnold et al.

(10) Patent No.: US 6,238,513 B1
(45) Date of Patent: May 29, 2001

(54) WAFER LIFT ASSEMBLY

(75) Inventors: Kimberley J. Arnold, Milton; John W. Lewis, Colchester; James N. Pinto, Essex Junction, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/473,920

(22) Filed: Dec. 28, 1999

(51) Int. Cl.[7] .................................................. C23F 1/02
(52) U.S. Cl. ................................................... 156/345
(58) Field of Search ........................... 118/728, 729; 156/345

(56) References Cited

U.S. PATENT DOCUMENTS 5,292,399 * 3/1994 Lee et al. ........................ 156/643
5,803,977 * 9/1998 Tepman et al. .................. 118/728

* cited by examiner

Primary Examiner—Richard Bueker
Assistant Examiner—Erin Fieler
(74) Attorney, Agent, or Firm—Connolly, Bove, Lodge & Hutz; James M. Leas, Esq.

(57) ABSTRACT

A wafer lift assembly including an RF shunt is provided. An insulating rim is connected to a powered lift cylinder via a conductive screw. The head of the screw is recessed below a top surface of the rim. A cover is arranged over top of the rim and screw. The RF shunt is a layer of conductive material arranged between the rim and the cover.

44 Claims, 3 Drawing Sheets

WAFER LIFT ASSEMBLY

TECHNICAL FIELD

The present invention relates generally to a radio frequency (RF) plasma reactor which can perform processes such as etching, chemical vapor deposition and the like on a semiconductor wafer held within the reactor. In particular, the invention is related to a wafer lift assembly including an RF shunt which smooths the plasma electric field.

BACKGROUND OF THE INVENTION

A plasma reactor may be used to clean oxides from a conductor or metal surface on a wafer. In operation, a wafer is placed upon a support surface or a pedestal within the process chamber. A process gas is introduced into the process chamber to perform the etching process and a plasma is formed in the process chamber proximate to the surface of the wafer. The plasma is ignited by coupling a substantial amount of energy to the process gas. The energy is typically supplied by an antenna surrounding the process chamber. The antenna is usually powered by an RF power source or a high AC or DC voltage applied between the chamber walls and the pedestal supporting the wafer.

Due to the large amount of energy which is coupled to the process gas to form the plasma, the process chamber can become quite hot. In order to control wafer temperature during the process, the wafer is clamped to a pedestal and a gas is circulated between the wafer and the pedestal. Due to the circulation of the gas, the wafer may be disturbed and move from its resting position upon the pedestal. Therefore, a clamping mechanism is needed to hold the wafer in place during the etching process.

In some instances, a mechanical lift assembly is used to hold the wafer in place. The lift assembly typically includes a cylindrical ring which is positioned around the etching surface of the wafer to hold the wafer in place upon the pedestal during the etching process. After etching is completed, the ring is lifted off the wafer. A robotic arm removes the etched wafer from the pedestal and replaces it with another wafer to be etched. To keep the procedure moving quickly, it is necessary that the cylindrical ring used for clamping be readily removable from the wafer.

One known type of cylindrical ring used to hold the wafer in place during the etching process is shown in FIG. 1. It includes a rim 4 made from an insulating material, such as Dupont Vespel®, and which is attached to a lift cylinder (not shown). The lift cylinder moves in a vertical direction and is used to move the rim 4 onto and off of the wafer. The rim 4 is typically attached to the lift cylinder by metal screws. Plastic or other type screws are generally unsatisfactory as they may melt or the elasticity of the plastic does not allow for sufficient clamping force to be applied to the wafer. If the metal screws are exposed to the plasma in the reactor chamber, a reaction takes place and impurities in the metal screws are introduced into the process gas. In order to prevent the metal screw from being exposed to the process gas and corrupting the etching process, a cover 8 is placed over the rim 4. The cover 8 is also made from an insulating material, such as Dupont Vespel®, which is compatible with the process chemistry and process conditions. However, the cover 8 wears out quickly, adding to the cost of operation.

Alternative designs have been proposed which eliminate the need for a mechanically fastened rim and cover. For example, U.S. Pat. No. 5,486,975 describes an electrostatic chuck which is used to hold a silicon wafer in place on the pedestal. Electrostatic chucks generally contain a pedestal supporting a dielectric layer and having an embedded electrode. An electrostatic clamping force is created between the wafer and a wafer support surface of the chuck by connecting the electrode to a high voltage, DC power supply. During the etching process, coulomb forces retain the wafer on the support surface of the chuck. U.S. Pat. Nos. 5,688,358 and 5,740,009 also show different types of electrostatic chucks.

Unfortunately, electrostatic chucks and other alternatives typically require an expensive design. Further, charge sensitive processes cannot tolerate process conditions associated with such electrostatic chuck designs. Therefore, there is a need for a cost-effective way to improve the life of the wafer lift assembly for processes which use clamps or covers in close proximity to the wafer surface.

SUMMARY OF THE INVENTION

A method and device for smoothing out the plasma electric field in a plasma reactor chamber is provided. In one embodiment of the invention, an RF shunt, which may be either floating or RF coupled, is provided in the reactor chamber.

In another embodiment of the invention, the RF shunt is positioned within a wafer lift assembly. The wafer lift assembly includes a rim which helps secure the wafer to a pedestal arranged in the reactor chamber. The rim is secured to a lift ring by metal screws. A cover is provided over the rim to isolate the metal screws from the plasma. The RF shunt is provided between the cover and the rim. The shunt is made from a conductive material and smoothes the electric field eliminating a focus effect of the plasma electric field created by the screws.

BRIEF DESCRIPTION OF THE DRAWINGS

The present invention will now be further described in the following pages of the specification when taken in conjunction with the attached drawings in which.

DETAILED DESCRIPTION OF THE INVENTION

Figure 1:
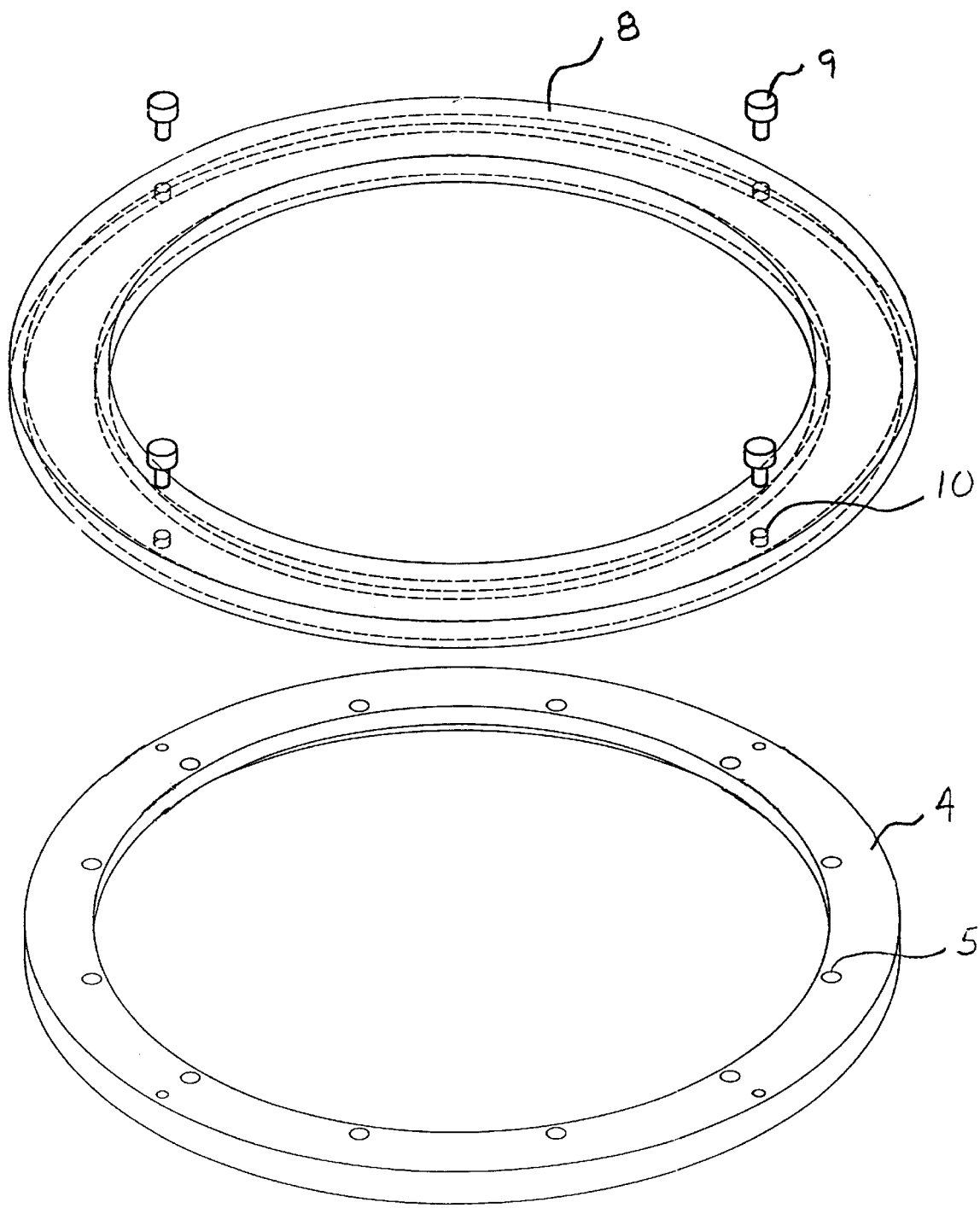
FIG. 1 is an exploded view illustrating a wafer lift assembly kit of the prior art.

While using a lift assembly as described above, the present inventors observed that the cover 8 of FIG. 1 wears unevenly. In particular, they noticed that the cover 8 wears at an increased rate in areas above the metal screws attached to the lift cylinder. This is believed to be caused by a higher electric field in the vicinity of the metal screws. The increased wear rate may result in the cover 8 being worn through exposing the metal screws and introducing impurities into the process chamber. This undesirable effect may occur if the cover 8 is not changed after the recommended number of uses or if a cover which has been taken out of service is unknowingly put back into use. Thus, the cover needs to be examined and changed frequently, increasing the cost of the etching process.

The present invention provides a method and apparatus for extending the life of a wafer lift assembly. The invention is preferably implemented in the context of a conventional RF plasma reactor used to perform reactive ion etching on a semiconductor wafer. Various types of plasma reactors are well known to one skilled in the art and have been generally described above.

An RF shunt is included in the plasma reactor and used to modify the plasma electric field so the effect of the plasma electric field is distributed evenly across a cover. The RF shunt may be an antenna arranged proximate to the metal screws. The antenna is preferably electrically floating, although it may be RF coupled to the metal screws or other components depending on the antenna's location. In one embodiment, the RF shunt is a conductive ring arranged between the rim and cover of the wafer lift assembly. The ring may be a coating formed on either the rim or cover or both.

An embodiment of the invention will now be described with reference to FIGS. 2 and 3. The wafer 14 is supported upon a pedestal 15 arranged within the reactor chamber. The pedestal 15 is connected to an RF power supply, not shown. The pedestal 15 typically includes an electrode 12 embedded therein. Here, the electrode 12 acts as a cathode and the cathode and the wafer 14 are at the same potential. A conventional RF power source is also provided in a known manner to control the bias potential of the plasma.

A typical wafer lift assembly includes a lift cylinder 16 that surrounds the electrode 12 and the wafer 14. FIG. 3 shows an exploded cross sectional view through one side of the a ring-shaped wafer lift assembly kit of the present invention. The lift cylinder 16 is connected to the pedestal 15 so that it is at the same potential as the wafer 14 and the electrode 12. In other words, the lift cylinder 16 is an RF hot surface when the reactor is operated. Additionally, the lift cylinder 16 is movable in a vertical direction as shown in the figures whereby a clamping member attached thereto is moved onto and off of the wafer 14. A clamp 20 is provided to secure the wafer 14 upon the pedestal 15 during the etching process. The clamp 20 is usually needed when a gas, such as helium, is circulated on an underside of the wafer 14 in order to keep the wafer 14 cool during the etching process. The clamp 20 is preferably a circular ring which is arranged on the lift cylinder 16. At various positions around the circumference of the lift cylinder 16, fingers 17 extend from the ring towards its center over the edge of the semiconductor wafer 14 to hold the wafer 14 in place against the forces of the circulating gas, as shown in FIG. 3.

A fastener 7, such as a screw, secures the clamp 20 to the lift cylinder 16. As the clamp 20 is preferably made of quartz, the screw 7 cannot go directly through the clamp 20 as the quartz is subject to fracture. Therefore, the rim and cover assembly shown in FIGS. 1, 2 and 3 is provided. The rim 4 is preferably made from an insulating material, such as vespel® and essentially acts as a washer. The rim 4 is intermittently provided with holes 5 through which the fasteners 7 are inserted. The fasteners 7 then pass through the clamp 20 and into the lift cylinder 16. In this manner, the clamp 20 is secured between the rim 4 and the lift cylinder 16. Preferably, the holes 5 are provided with a recess so that when the clamp 20 is secured between the rim 4 and the lift cylinder 16, the top 19 of the fastener 7 is recessed below a top surface 21 of the rim 4.

In order to provide adequate clamping force, the fasteners 7 are preferably metal screws, made from, for example, stainless steel or titanium. Plastic screws may not provide adequate clamping force as they may stretch when subjected to the mechanical forces exerted upon them. Additionally, plastic screws may melt when subjected to the high levels of heat present during the RIE process. Titanium provides advantage in that even if the screws become exposed to the plasma, titanium is not detrimental to semiconductor wafers, as are some components of stainless steel, such as nickel.

A cover 8, formed of a non-metallic material, such as Dupont vespel®, G.E. Lexan®, or a similar plastic, is provided over the rim 4. The cover 8 is necessary to isolate the fasteners 7 from the plasma formed during the etching process. If the metal screws 7 are exposed to the plasma atmosphere, the screws 7 evaporate resulting in elements contained in the metal, such as nickel or iron, contaminating the plasma or the evaporation of other screw material adversely affecting the etching process. Therefore, the cover 8 is preferably arranged to enclose the top surface of the rim 4 so that the screws 7 are not exposed to the plasma. The cover 8 is preferably secured to the rim 4. This may be done with fasteners made from an insulating material. As shown in FIGS. 1–3, screws 9 are inserted through holes 10 formed in cover 8. The screws 9 are received in corresponding holes 6 formed in the rim 4. The screws 9, preferably made of the same material as cover 8, may then be tightened to secure the cover 8 to the rim 4. Screws 9 will be exposed to the plasma during etching and should not be made from a material which will corrupt the etching process.

Fasteners 7 are connected to the lift cylinder 16 and, as such, are also a RF hot surface and at the same potential as the wafer 14, electrode 12 and lift cylinder 16. Thus, the fasteners 7 are a powered conductor. The cover 8 separates the fastener 7 from the plasma. The cover 8 is made from an insulating material, resulting in a focus of the plasma ions over the metal fasteners 7. The focus of the ions causes the cover 8 to wear at an uneven rate. If the cover 8 is not changed in the recommended amount of time, or a cover is accidentally reused, the uneven wear rate could result in the plasma punching through cover 8 during the etching process. This causes the evaporation of the screw and various process problems.

The present inventors have experimentally determined that providing an RF shunt, such as conductive layer 18, smoothes the field of the plasma, resulting in an even wear rate of the cover 8. The RF shunt is preferably a conductive layer 18 arranged between the cover 8 and the top surface 21 of rim 4. The conductive layer 18 reduces the uneven wear of the cover 8 over the fasteners 7.

Figure 2:
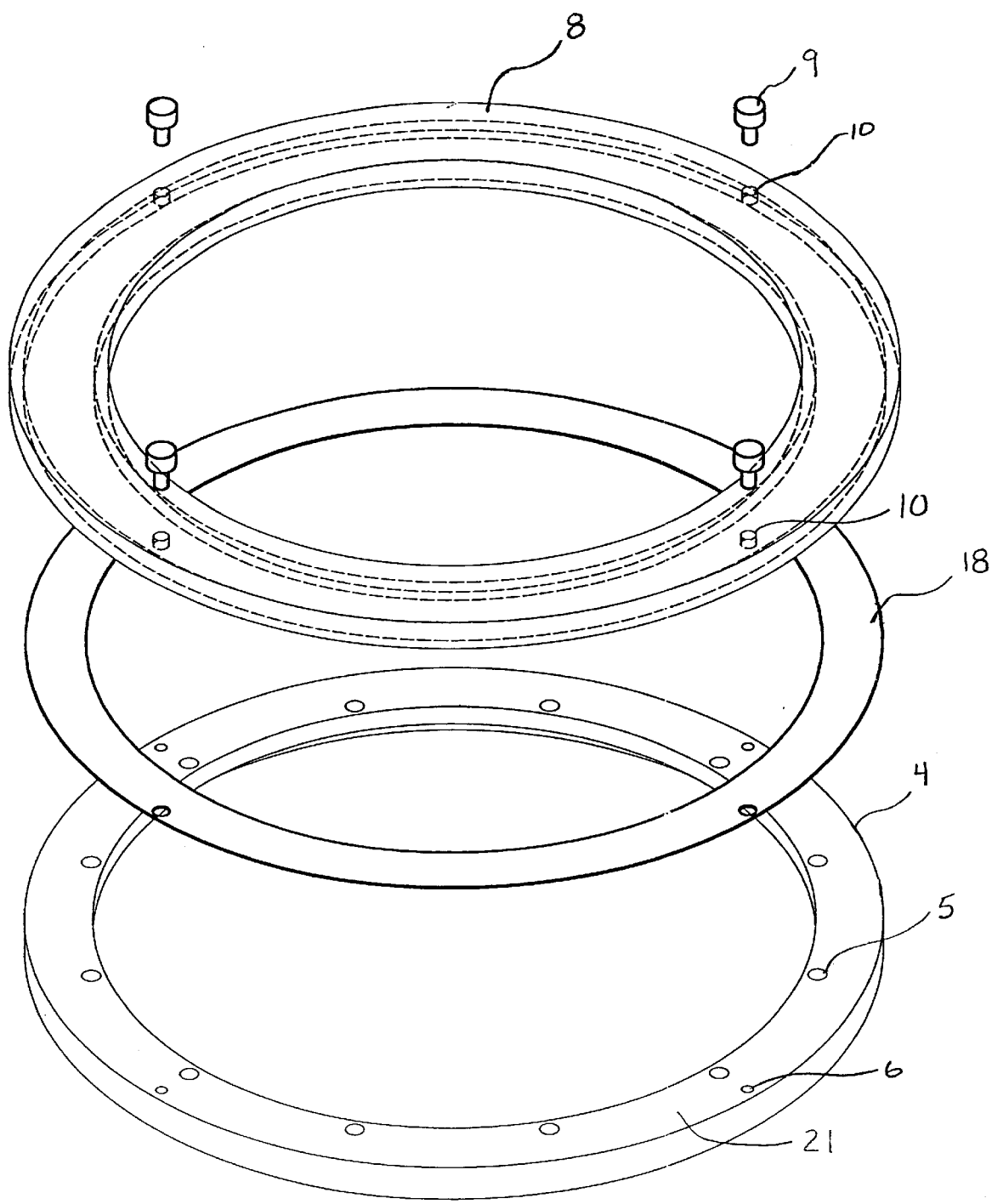
FIG. 2 is an exploded view illustrating a wafer lift assembly kit of the present invention including a conductive layer.
Figure 3:
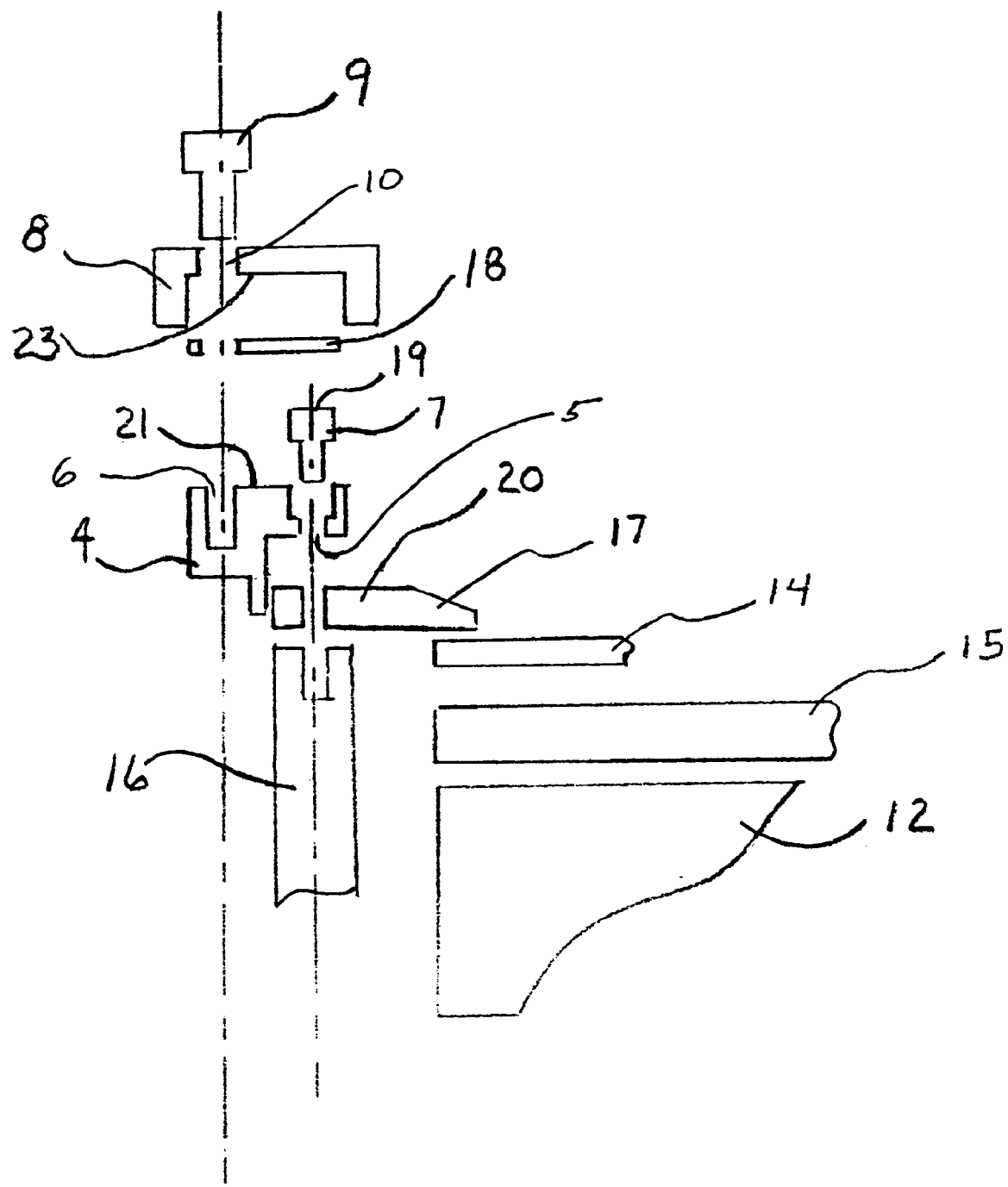
FIG. 3 is an exploded cross sectional view through one side of the a ring-shaped wafer lift assembly kit of the present invention including the conductive layer.

As shown in FIGS. 2 and 3, the shunt may be a layer 18 arranged between the cover 8 and the rim 4. The fasteners 7 should be recessed in the rim 4 so that the layer 18 does not contact the fasteners 7. By keeping the fastener 7 from directly contacting the layer 18, layer 18 is left unpowered, either DC grounded or floating. However, the layer 18 may be said to be RF coupled to the fastener 7.

Additionally, the layer 18 should not be directly exposed to the plasma. The layer 18 is preferably made from a conductive material, such as aluminum, and extends entirely around rim 4. Although the conductive layer 18 may be virtually any thickness, from less than one mil to more than 0.125 inch, typically it is between 0.020 to 0.03 inches in thickness. It is believed that a thicker conductive layer performs better. However, if the layer 18 is made too thick, it may not fit between the rim and cover of wafer lift assemblies currently in use. Therefore, the layer 18 preferably has a thickness so that it fits in the existing space present in known wafer lift assemblies. Of course, if a thicker layer 18 is desired, the rim 4 and cover 8 could be modified to enclose the layer 18 and fasteners 7 so they are not exposed to the plasma.

Additionally, layer 18 may be a coating formed on a bottom surface 23 of cover 8 or the top surface 21 of rim 4. Placing the coating on the bottom surface 23 of cover 8 is preferable since it would completely cover fastener 7. Preferably, the conductive layer 18 may be manufactured as an integral complete unit on the bottom surface 23 of cover 8. Conductive layer 18 can be tight press fit into a recess in bottom surface 23 or conductive layer 18 can be formed by depositing metal on bottom surface 23 using well known deposition methods. In this case, conductive layer 18 could be significantly thinner than 0.02 inches.

Accordingly, an improved wafer lift assembly has been provided. This method and apparatus allow covers of wafer lift assemblies to be used for extended periods of time compared with known wafer lift assemblies.

While a preferred embodiment of the invention has been described above, since variations in the invention will be apparent to those skilled in the art, the invention should not be construed as limited to the specific embodiment described above. For example, other means of attaching the cover and the rim to the lift assembly may be used.

We claim:

1. A plasma system comprising:
   a first insulator on a powered conductor and held thereto with a fastener;
   a second insulator covering the first insulator and the fastener; and
   a conductor between the first insulator and the second insulator, the conductor for reducing uneven etching of the second insulator over the fastener.

2. A plasma system as recited in claim 1 wherein the conductor is a ring.

3. A plasma system as recited in claim 1 wherein the conductor is a coating on a surface of the first or second insulator.

4. A plasma system as recited in claim 3 wherein the coating is on a lower surface of the second insulator.

5. A plasma system as recited in claim 1 wherein the conductor is aluminum.

6. A plasma system as recited in claim 1 wherein the first insulator and the second insulator are vespel.

7. A plasma system as recited in claim 1 wherein the fasteners are recessed into the first insulator.

8. A plasma system as recited in claim 1 wherein the fasteners comprise titanium.

9. A wafer lift assembly comprising:
   a rim secured to a lift cylinder via fasteners;
   a cover over top of the rim; and
   a ring-shaped conductor arranged between the rim and the cover.

10. A wafer lift assembly according to claim 9 wherein the rim and the cover are made from an insulating material.

11. A wafer lift assembly according to claim 9 wherein the rim is ring-shaped.

12. A wafer lift assembly according to claim 9 wherein the fasteners are made from a conductive material.

13. A wafer lift assembly according to claim 9 wherein the lift cylinder is a powered conductor.

14. A wafer lift assembly according to claim 9 wherein the fasteners are recessed in the rim.

15. A plasma system as recited in claim 9 wherein the fasteners comprise titanium.

16. A wafer lift assembly according to claim 9 wherein the conductor is a layer formed on a side of the cover facing the rim.

17. A wafer lift assembly according to claim 9 wherein the conductor is a layer formed on a top surface of the rim.

18. A wafer lift assembly according to claim 9 further comprising a clamping element held between the rim and the lift cylinder.

19. A wafer lift assembly according to claim 18 wherein the clamping element is non-conductive.

20. A wafer lift assembly according to claim 18 wherein the fasteners pass through the rim and the clamping element into the lift cylinder.

21. A wafer lift assembly according to claim 11 wherein the conductor is ring shaped.

22. A wafer lift assembly according to claim 18 wherein the clamp is ring shaped with fingers extending towards its center.

23. A wafer lift assembly according to claim 9 wherein the fasteners are titanium.

24. A wafer lift assembly according to claim 9 wherein the lift cylinder is aluminum.

25. A wafer lift assembly according to claim 9 wherein the conductor is RF coupled to the fasteners.

26. A wafer lift assembly according to claim 9 wherein the conductor is DC grounded.

27. A wafer lift assembly according to claim 9 wherein the conductor surrounds the wafer.

28. A wafer lift assembly according to claim 9 wherein the conductor is substantially coplanar with the wafer when the lift cylinder is in the down position.

29. A wafer lift assembly according to claim 9 wherein the conductor is electrically floating.

30. A wafer lift assembly according to claim 9 wherein the lift cylinder and the fasteners are at the same potential.

31. A wafer lift assembly according to claim 9 wherein the conductor is enclosed by the rim and the cover.

32. In a plasma etching device including a pedestal for supporting a wafer, an electrode arranged below the pedestal and a lift cylinder for moving a clamp onto and off of the wafer, an apparatus for securing the wafer to the pedestal comprising:

a rim connected to the lift cylinder by fasteners, the clamp being held between the rim and the lift cylinder;

a cover arranged above the rim; and a ring-shaped conductor arranged between the rim and the cover.

33. The apparatus of claim 32 wherein the lift cylinder is a powered conductor and the fasteners are made from a conductive material.

34. The apparatus of claim 33 wherein the fasteners are recessed below a top surface of the rim.

35. The apparatus of claim 32 wherein the fasteners comprise titanium.

36. The apparatus of claim 34 wherein the conductor is a layer formed on the top surface of the rim.

37. The apparatus of claim 34 wherein the conductor is a layer formed on a bottom surface of the cover.

38. The apparatus of claim 33 wherein the conductor is electrically floating.

39. The apparatus of claim 33 wherein the conductor is RF coupled to the fasteners.

40. The apparatus of claim 32 wherein the cover encloses the conductor and fasteners.

41. The apparatus of claim 32 wherein the clamp holds the wafer to the pedestal when the lift cylinder is in a down position.

42. In a plasma etching device including a pedestal supporting a wafer, an electrode embedded in the pedestal, and a lift cylinder for moving a clamping element onto and off of the wafer, a plasma field-smoothing apparatus comprising:

a rim connected to the lift cylinder by fasteners, the fasteners and the lift cylinder being powered;

a cover isolating the fasteners from the plasma; and a shunt arranged to smooth the plasma over the fasteners.

43. The apparatus of claim 42 wherein the shunt is an RF antenna.

44. The apparatus of claim 43 wherein the antenna is RF coupled to the fasteners.

* * * * *